United States Patent [19]
Dahlquist

[11] Patent Number: 5,501,755
[45] Date of Patent: Mar. 26, 1996

[54] LARGE AREA MULTI-ELECTRODE RADIATION DETECTOR SUBSTRATE

[75] Inventor: John C. Dahlquist, Maplewood, Minn.

[73] Assignee: Minnesota Mining and Manufacturing Company, St. Paul, Minn.

[21] Appl. No.: 198,614

[22] Filed: Feb. 18, 1994

[51] Int. Cl.⁶ .................................................. B32B 31/00
[52] U.S. Cl. ................... 156/153; 156/275.5; 156/275.7
[58] Field of Search .............................. 156/275.5, 275.7, 156/153

[56] References Cited

U.S. PATENT DOCUMENTS

| | | |
|---|---|---|
| 31,847 | 3/1985 | Luckey . |
| 4,176,275 | 11/1979 | Korn et al. . |
| 4,258,264 | 3/1981 | Kotera et al. . |
| 4,276,473 | 6/1981 | Kato et al. . |
| 4,315,318 | 2/1982 | Kato et al. . |
| 4,387,428 | 6/1983 | Ishida et al. . |
| 4,897,338 | 1/1990 | Spicciati et al. . |
| 5,219,712 | 6/1993 | Evans . |
| 5,244,534 | 9/1993 | Yu et al. . |
| 5,268,569 | 12/1993 | Nelson et al. . |

OTHER PUBLICATIONS

Pyralux Sales Bulletin. At least one document dated Jun., 1983 from DuPont, Inc.

*Primary Examiner*—Chester T. Barry
*Attorney, Agent, or Firm*—Gary L. Griswold; Walter N. Kirn; Mark A. Litman

[57] ABSTRACT

A process for making an electrical interconnect comprising the steps of adhering a flexible electrical circuit to the surface of a substrate, building conductive posts on said flexible electrical circuit, putting a curable dielectric composition around said posts, and curing said composition.

20 Claims, 1 Drawing Sheet

LARGE AREA MULTI-ELECTRODE RADIATION DETECTOR SUBSTRATE

BACKGROUND OF THE ART

1. Field of the Invention

The present invention relates to the field of multi-layered printed circuits or semiconductors and their manufacture, and particularly to the field of large area radiation detectors, their construction and their manufacture.

2. Background of the Invention

Many different types of electronic configurations are formed on one surface or in one layer and electrically connected to other devices or configurations. For example, semiconductor devices such as integrated circuits are integrated into a substrate (such as silicon wafers) in the form of patterned zones in both horizontal and vertical directions. The zones in the horizontal planes may be conductive or semiconductive to provide specific responses to electrical or radiation influences. The zones may also be formed of materials and arrangements which are of different conductivities. This type of construction is important for transistor and diode manufacture. Many thousands of individually responding units can be placed on single wafers by known techniques.

Large area radiation detecting devices have some features which are similar to integrated circuit wafers, but have many different physical and functional requirements. A large area radiation detector must capture radiation in small areas of the detector surface and then be able to capture, convert or release that information in a form readable by other devices. This type of detector is a significant advance over earlier versions of radiation capture devices in which radiation was captured by phosphors, then emitted upon stimulation by applied radiation (these types of devices shown for example in U.S. Pat. No. Re. 31,847 and U.S. Pat. Nos. 4,258,264; 4,315,318; 4,387,428; and 4,276,473). Devices in which the radiation was released as different wavelengths of light were easily configured to generate images (hard copy or electronically captured a second time), but there was a significant reduction in resolution because of the nature of the image conversion and recapture.

Large area radiation detectors provide an opportunity for direct electronic conversion of impacting radiation into electronic signals. It is a part of this process to collect charge (electronic signals) which is a representation of image information or data. The limitation on resolution in the image electronically transmitted from the detector is the resolution of the electronic structure and scanning process. With the many advances made in circuit construction, the resolution of circuitry can excede the resolution readily perceived by unaided visual examination.

In the formation of integrated circuits, where the dimensions between layers is very small (e.g., less than 5 micrometers), conductive interconnectors can be formed between layers by etching thin layers (on top of one electronically active layer) to leave small conductive posts on which is built another electronically active layer (with or without an insulative material filling in the area between the posts). U.S. Pat. No. 5,244,534 describes such a process for forming posts between layers in an integrated circuit. The constraints on the insulating composition (if any) between layers is not significant because the dimensions are so small. Significant percentages of shrinkage, for example, are not highly detrimental, since no filling composition is essential as there is little physical structural support needed in the wafers.

Large area detectors are much larger devices than integrated circuitry and also requires greater thickness to withstand higher levels of physical stress and reduce capacitive signal coupling due to the large number of electrode crossovers common to many circuit paths. Where integrated circuit layer separations are generally on the order of 5 microns or less, large area detectors must be greater than 50 micrometers in thickness, and often may be from 75–200 micrometers in thickness. It can be readily seen that with a full order of magnitude difference in thickness, different physical needs must be met in the different constructions between integrated circuitry and large area detectors. Integrated circuit die periphery dimensions (its sides) are also generally on the order of one-half inch (1.27 cm) or less, while large area detectors are presently used with up to seventeen inches (43.2 cm) per side.

SUMMARY OF THE INVENTION

Figure 1:
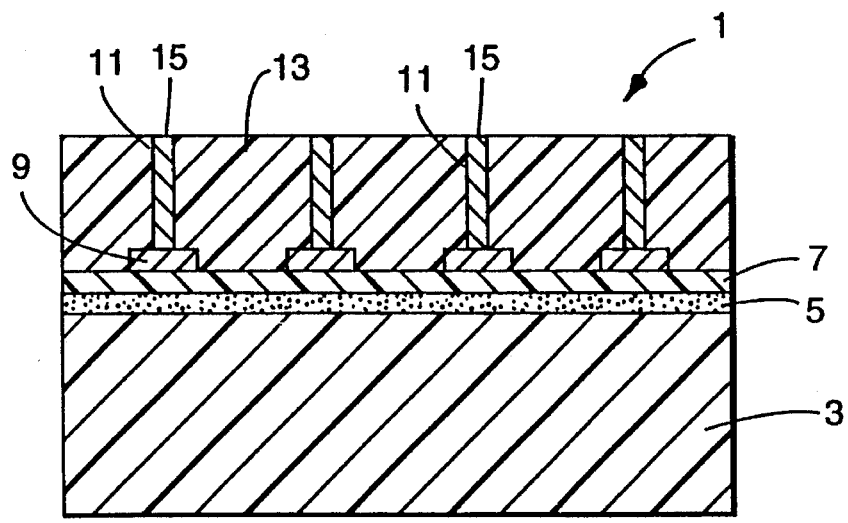
FIG. 1 shows an interconnect system 1 of the present invention.

A large area radiation detector may be formed by providing a substrate, applying a conductive circuit (especially a flexible conductive circuit) to at least one surface of the substrate, placing conductive posts on the circuit, encapsulating the posts, and placing a second conductive layer in electical contact with the posts. The use of a low shrinkage cure, radiation curable insulating resin as the encapsulating material for the posts provides a simple and effective method for protecting the posts and providing durability to the construction of the detector.

DETAILED DESCRIPTION OF THE INVENTION

A large area radiation detector according to the present invention comprises at least a substrate having a conductor on at least one surface, metal posts on said conduct, an insulating encapsulating material around said posts. There may be a first conductive layer (e.g., electrodes) in electrical contact with the top of the posts. The circuit may be attached to the substrate using an adhesive layer between the substrate and the e.g., flexible circuitry, or alternatively a process can provide circuitry directly onto the substrate (e.g., glass, polymeric film base, or the insulating materials). Barrier layer(s) are often used over the first conductive layer to protect the conductive layer from the chemical and/or physical action of materials on that surface. Semiconductive layers and/or photoconductive layers may be present over the first conductive layer (and, if present, over the barrier layer as in U.S. Pat. No. 5,268,569). A second protective or electrically insulative layer may be present over the semiconductive/photoconductive layer. A second adhesive may be used between the last two described layers. It may also be desirable for a conductive layer to be present over the second protective layer.

The substrate may be any film or sheet forming material including, but not limited to metals (e.g., aluminum), ceramics, glasses (e.g., tempered glass, sodium lime glass), metallized polymers (e.g., aluminized polyester), and the like. Substrates which can provide a smooth and flat surface upon which to build the large area detector are preferred, such as glasses and ceramics. The surface of the substrate may have a flatness of less than 0.0002 inches (5 micrometers, but less than 30 micrometers is usually sufficient) from a reference plane (that is the surface should not deviate from a reference plane by more than 0.0002 inches, 5 micrometers), a parallelity of less than 0.0003 (7.6 micrometers) inches (that is, the two opposed surface of the substrate should not vary in thickness from each other by more than 0.0003 inches 7.6 micrometers), and can be lapped to a finish of at least 0.000002 (0.05 micrometers) or 000015 (0.4 micrometers) inches (that is, as measured on a surface profiling instrument such as a Tencor Instruments Alpha Step (200). The substrate may be of any desired thickness, with a generally nominal thickness of 0.01 (0.25 mm) to 0.5 (12.7 mm) inches in thickness being a convenient range. A thickness of 0.05 (1.3 mm) to 0.4 (10.2 mm) inches would be preferred.

Adhesives which have proven useful between the substrate and the flexible circuit layer are somewhat dependent upon the specific substrate chosen and the specific composition of the flexible circuitry chosen. Commercially available adhesives, especially electronic bonding adhesives. DuPont Pyralux™ WA/A adhesive film is a good choice for some of the materials described in the present invention. Pressure sensitive adhesives might also work.

The circuit material may be composed of any material which can form a useful electrical circuit. Metal foils are preferred, especially copper, gold, or silver foils, while metallized polymeric film (e.g., copper clad polyimide), and GFT Flexible Circuit (3M, GFT 106 and GFT 1080) may also be used.

The conductive posts are generally metal posts or metal-filled polymer, and most preferably are metal posts which can be formed by plating (e.g., electroplating). Nickel and copper have been especially used, with the latter most preferred. Any metal which can be plated, and ground however, can be used.

FIG. 1 shows an interconnect 1 of the present invention which comprises a substrate 3, the optional adhesive layer 5, a flexible circuit 7, an optional metallic or conductive support 9 sometimes refered to as a pad, conductive post 11, and the polymeric dielectric 13. The exposed portion 15 of the post 11 would electrically contact an image capture device (not shown).

Figure 2:
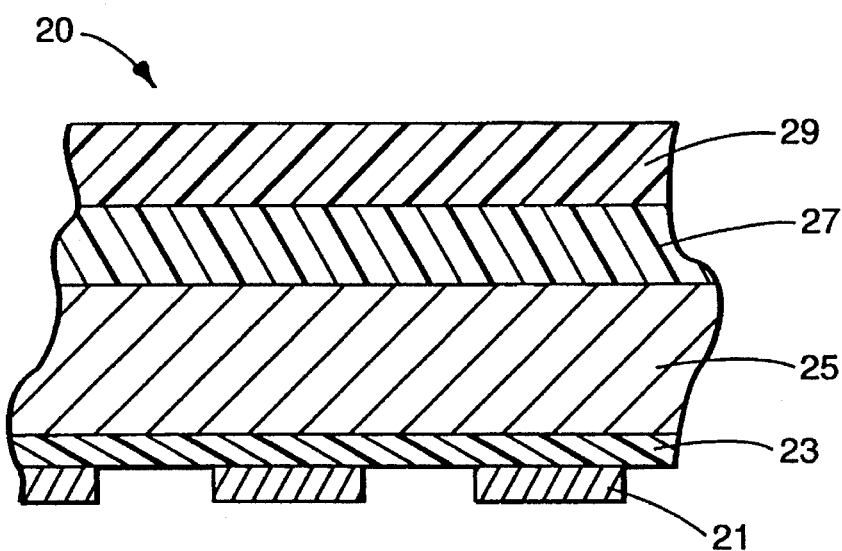
FIG. 2 shows an image capture device 20 to which the interconnect (not shown) of the present invention may be attached.

FIG. 2 shows one alternative construction for an image capture device 20. The image capture device 20 comprises electrodes 21, electrically blocking layer (barrier layer) 23, photoconductive layer 25, insulating layer 27, and a first conductive layer 29, for example an indium tin oxide layer.

Figure 3:
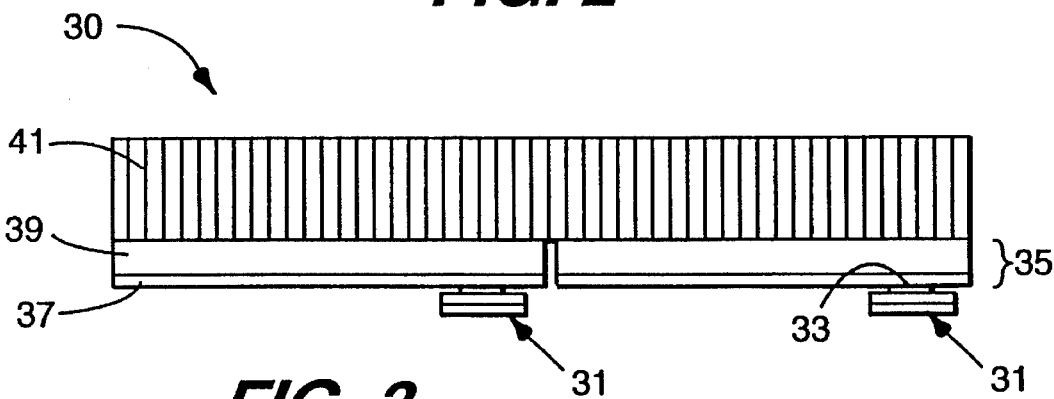
FIG. 3 shows an alternative image capture device 30 for use with the interconnect (not shown) of the present invention.

FIG. 3 shows a second alternative image capture device 30 comprising optional electrodes 31, solder bumps 33, a single unit sensor 35 comprising circuitry 37 and photosensitive detector 39, and a structured phosphor 41.

The interconnect 1 of the present invention would be connected to an image capture device by the exposed area 15 of the conductive posts 11.

As the encapsulating material, a low shrinkage radiation (e.g., e-beam, UV, visible, or infrared radiation) curable insulative polymer is most useful. Epoxy resins are the polymers of choice, and higher glass transition temperature polymers (e.g., $T_g$ higher than 110 degrees F, more preferably higher than 125, and most preferably higher than 130° F. and even 150 and higher are particularly desirable. The epoxy will preferably exhibit low shrinkage during radiation curing (e.g., at most 4% linear shrinkage, preferably less than 2.5% linear shrinkage, and most preferably less than 2 or less than 1% linear shrinkage during cure), a Shore D hardness of at least 70, preferably at least 80 and most preferably 90 or higher (to facilitate grinding and lapping of the layer), and preferably will be of electronics grade composition (with fewer than 50 ppm, more preferably less than 25 ppm Na, K, and Cl), have a dielectric strength of at least 350, preferably at least 400 and more preferably at least 450 volts/mil, and a volume resistivity of at least $5.0 \times 10^{14}$ or at least $1.0 \times 10^{15}$ ohms-cm. Preferred epoxy resins meeting some or all of these desired properties include Emcast™ 1550Li and 1902. It is also desirable for the composition before cure to have a viscosity which will enable it to flow around the posts without pressure having to be applied to the composition which would damage the posts. It is desirable that the uncured dielectric composition have a viscosity at room temperature of less than 25,000 cps, and more preferably less than 20,000 cps. The primary concern with viscosity is that the composition is able to flow around the posts at a temperature (even elevated) at which the composition does not rapidly cure or damage the posts and the surface.

The encapsulating material is preferably made from curable compositions with less than 5% volatile solvent content to reduce shrinkage. Preferably the composition will contain less than 1% solvent or be completely free of volatile solvent. Self-plasticizing copolymerizable components may be present in larger amounts, but conventional solvents tend to increase shrinkage of the film if present during cure. Radiation curable compositions are preferred, with photoinitiators present in the composition to more rapidly effect cure. Non-gas producing photoinitiators (e.g., triarylsulfonium and diaryliodonium complex anion photoinitiators) are preferred as compared to diazonium photoinitiators.

After encapsulation of the posts and curing of the dielectric composition, the surface is ground to form a smooth flat surface exposing the posts. If desired image capture devices such as those shown in FIG. 3 can be interconnected by attaching them directly to the posts. Such a construction for a detector is shown in copending commonly assigned U.S. patent application Ser. No. 08/163,147. There may be an optional metal deposition followed by lithography to form electrodes on the posts.

Embodiments using the interconnect with a photoconductive plate construction U.S. Pat. No. 5,268,569 FIG. 2.

The barrier layer is usually a polymeric film forming layer or inorganic metal oxide layer which can assist in reducing migration of materials between layers or prevent penetration into lower layers by materials which contact the surface of the detector (e.g., cleaning materials, toners, solvents, sometimes oxygen, and other environmental materials). Polycarbonates, polyesters, cyanate resins (e.g., AroCy 50 from Hi-Tek Polymer, Inc.), epoxy resins (e.g., photocured or solvent cast Emcast 1550Li in methyl isobutyl ketone), thin metal films (e.g., Titanium or Tantalum), aluminum oxide (e.g., produced by electrochemical means such as that shown by M. S. Hunter and P. Fowler, *Journal of the Electrochemical Society*, September, 481–485 (1954), zirconium oxide, tin oxide, silicon oxide, and the like are examples of useful materials for this layer.

The photoconductor or semiconductor layer for a large area radiation detector may be any semiconductor or photoconductor material that provides the desired range of response to the radiation intended to be used in the radiation source system. Both organic and inorganic semiconductors or photoconductors are contemplated in the practice of the present system. This includes, but is not limited to poly-N-vinyl carbazoles, CdS, Selenium, lead oxide, mercurous iodide and the like may be considered. Amorphous selenium is the preferred photoconductive material.

The various other layers which may be present on the large area detector include a protective layer (e.g., polymeric film layer for abrasion and/or chemical barrier protection of the underlying layers). This layer may be directly applied to the photoconductor or applied through an adhesive layer. If an adhesive layer is used, it is preferred to use a radiation curable (e.g., UV curable) solvent-free adhesive layer such as an epoxy adhesive. As the protective layer is preferably transparent, a radiation curable adhesive layer can be cured through the protective layer. Otherwise, a delayed cure (a system with a controlled induction period for cure) can be used. The protective layer may be any film forming material which meets the physical needs for protection of the underlying layer, and is most conveniently a polymeric film such as polycarbonate. Other useful protective layers would include polyimides, polyacrylates, etc. A surface conductive layer may also be placed on top of the protective layer. This layer may comprise any radiation transmissive material such as thin metallic or inorganic oxide film, conductive polymer, etc.

In general, a base conductor pattern is formed in the metal by etching or plating. Vertical posts are plated onto the conductors in specific locations on the base layer conductors. This is conveniently accomplished by forming an image in thick photoresist (0.002 to 0.004 inches [50.8 to 101.6 micrometers] or thicker) and electroplating the post to the top of the resist. The resist is stripped away leaving vertical posts. The resulting post structure is encapsulated in an insulating material. The dielectric encapsulation provides electrical isolation as well as mechanical support for the fragile post structure. Mechanical stresses must not be introduced into the substrate structure while curing the dielectric or insulator.

A dielectric meeting the necessary requirements of the present invention is used. The material is coated (e.g. bar coated) onto the large area substrate covering the posts. The material used is then cured using ultraviolet light. The dielectric coating is then ground flat and parallel to the back of the substrate. All of the functional interconnecting metal posts must be exposed at the surface. A surface lap is done to insure the proper degree of surface finish.

Metal is then applied to the lapped surface. The top high density electrode pattern is registered to the posts and then etched into the metal using photolithographic means. Contact to the buried conductors is made where the top electrode line crosses the posts. The multi electrode plate is then ready for additional layers or device attachment. Metal electrodes may not be needed if the exposed posts are used as the contact points for attachment of any capture or transmitting device.

In this invention, there is an approach for producing a multilayer interconnecting system for large area plates (e.g., 8×10 inches [20.3×25.4 cm] or 14 by 17 inches [35.6×43.2 cm] or larger). The approach improves yield, reduces production time, reduces raw material costs, and does not involve any high temperature curing processes.

Process for constructing an article according to the present invention would include:

1. A glass substrate is ground flat. Opposite surfaces are parallel to each other within 0.0004". The surface roughness is 17 micro inches +/−3 micro inches. Planerazation on the glass (or other insulating substrate material) must be performed in preparation for the following steps.

2. A 0.003" to 0.005" thick FR4, BT, or other similar circuit material is attached to the glass substrate surface. In this example, a single side copper clad material was used. The copper was either one ounce or one half ounce. The circuit material was attached to the glass using a DuPont w/a adhesive film. Other suitable adhesives can be used. A fast curing ultraviolet sensitive or thermally curable adhesive is desirable.

3. The base interconnecting pattern is defined on the copper by standard photolithographic methods. The metal pattern is produced by etching. The photoresist used to define the pattern is now removed and the surface is cleaned.

4. A layer of thick photoresist is applied to cover the etched metal pattern. Art work containing post locations is now registered to the existing pattern. The photoresist is exposed and developed. Holes in the resist now exist where metal is to be plated to form posts. Posts are plated to the base conductor. A second layer of resist may be applied and imaged to produce a thick photoresist before plating. The posts can be plated to the top of the resist and allowed to overplate until all of the posts reach the resist surface. Sanding off the excess metal using a fine grit paper will insure all of the posts are flush with the surface of the resist. The resist is then removed.

5. The next step was found to be most critical in the process. It allowed production of large area plates with a reduction in dielectric material, cost and time. An electronic grade ultraviolet cured epoxy (Emcast 1500 Li clear) was found to perform as the dielectric and encapsulate. Emcast 1500 Li was bar coated onto the surface containing the conductors and posts. The tops of the posts were buried below the coating surface by 0.003" to 0.007" (76.2 to 177.8 micrometers). Warming the plate to 60 degrees C. allows the Emcast epoxy to flow around the posts and conductors. Vacuum degassing of the epoxy can be done at this time. However, the vacuum degassing step is not necessary.

6. The plate was placed in a photoresist exposure unit where ultraviolet light from a mercury vapor lamp initiated the cure. The exposure time was 20 to 60 seconds. The time was determined by the power and wavelength of light delivered by the UV lamp. No heating was involved with the cure. A minimal amount of stress was introduced during the epoxy cure. The substrate was not deformed by the epoxy cure nor were the posts damaged. The cure time was only a few minutes instead of hours. Previous methods used by vendors involved cure times of one to eight hours at temperatures of up to 400 degrees C.

The ultraviolet cure (e.g., of the epoxy) can be completed in the exposure unit. Such equipment, depending upon the initiator and composition used in the formulation, may include a long UV output lamp (e.g., 325–420 nm). The cure cycle may be optionally accelerated by placing the plate in an oven at 40 to 60 degrees C. Complete cure took place in several minutes. The low temperature cure worked well and did not introduce any noticeable warp or bend in the substrate. This is important, since the subsequent grinding steps must be done on a flat surface to control dielectric thickness and subsequent interelectrode capacitance.

7. The top surface of the cured epoxy was ground flat and parallel to the substrate. The plate was held flat on the grinding table and grinding was done until all of the posts were exposed. The surface was now lapped to a suitable finish. In this case a 6 to 8 micro inch finish was satisfactory.

8. The lapped surface was vacuum metalized. Seeding of the surface for electroless plating followed by electroplating is also acceptable. Photolithographic methods are used to produce a high density top electrode pattern in register with the interconnecting posts. The final metal image is produced by metal etching. Resist removal and cleaning are the final process steps.

Until this process was adopted, vendors had tried unsuccessfully for over a year to deliver usable detector plates. Many processes were tried and found lacking. Each of the approaches tried had their own problems, but in general the problems were tied to materials selection, surface flatness, and reliable interconnections.

Key factors involved in the benefits of the present invention are as follows. The process starts with a flat and parallel substrate. A thin and uniformly thick copper clad insulator (single side copper) material is laminated onto the substrate. Solid metal posts which are quite high are required. The height controls capacitance between crossing conductors. The use of a radiation cured liquid dielectric material which has low shrinkage when cured prevents post damage. The encapsulation material has a low ionic content and a high resistivity.

The Emcast 1500 Li clear which was used here has the following properties. Ionic impurities have a maximum of 25 ppm (parts per million) total of Na, K, and Cl. Volume resistivity of the dielectric is $1.0 \times 10^{15}$ ohms.cm. Dielectric strength is 450 volts/mil. It is estimated that 50 or imparity levels of less than 40, or preferably less than 25 ppm are desired and that the sensitivuty is at least $10^{13}$.

The physical properties of the 1500 Li clear are important for coating and surface finish. The 1500 Li has a viscosity of 500 cps, a hardness of 90 Shore D, and a Tg of 150° C. Insufficient hardness causes problems in the grinding and lapping process. This material is soft enough so excess stress is not produced in the dielectric layer, but hard enough to be ground and lapped. Other Emcast materials with Shore D hardnesses of 82 to 86 were found to be useful but slightly soft for grinding and did not adhere as well to the substrate material.

What is claimed is:

1. A process for making an electrical interconnect comprising the steps of adhering a flexible electrical circuit to the surface of a substrate, building conductive posts on said flexible electrical circuit, putting a curable dielectric composition around said posts, and curing said composition.

2. The process of claim 1 wherein after said curing, the composition is ground to provide a smooth and flat surface.

3. The process of claim 1 wherein said curable composition is cured to a dielectric polymer having a Shore D hardness of at least 80.

4. The process of claim 3 wherein said curable composition is cured to a dielectric polymer having a Shore D hardness of at least 90.

5. The process of claim 1 wherein said curable composition contains fewer than 50 parts per million of K, Na, and Cl.

6. The process of claim 4 where said curable composition contains fewer than 50 parts per million of K, Na, and Cl.

7. The process of claim 1 wherein said curable composition has a viscosity of less than 25,000 cps at room temperature.

8. The process of claim 2 wherein said curable composition has a viscosity at room temperature of less than 25,000 cps.

9. The process of claim 4 wherein said curable composition has a viscosity of less than 20,000 cps at room temperature.

10. The process of claim 1 wherein said curable composition is cured to a polymer having a dielectric strength of at least 350 volts/mil.

11. The process of claim 4 wherein said curable composition is cured to a polymer having a dielectric strength of at least 400 volts/mil.

12. The process of claim 9 wherein said curable composition is cured to a composition having a dielectric strength of at least 400.

13. The process of claim 1 wherein curing said composition causes a linear shrinkage in said composition of less than 4%.

14. The process of claim 4 wherein curing of said composition causes a linear shrinkage of said composition of less than 2.5%.

15. The process of claim 9 wherein said curing of said composition causes a linear shrinkage of said composition of less than 2.5%.

16. The process of claim 12 wherein curing of said composition causes a linear shrinkage of said composition of less than 2.5%.

17. The process of claim 4 wherein said curable composition comprises a curable epoxy resin.

18. The process of claim 7 wherein said curable composition comprises a curable epoxy resin.

19. The process of claim 9 wherein said curable composition comprises a curable epoxy resin.

20. The process of claim 12 wherein said curable composition comprises an epoxy resin.

* * * * *